(12) United States Patent
Okamoto

(10) Patent No.: US 7,915,892 B2
(45) Date of Patent: Mar. 29, 2011

(54) MAGNETIC RESONANCE IMAGING APPARATUS AND MAGNETIC RESONANCE IMAGING METHOD

(75) Inventor: Kazuya Okamoto, Saitama (JP)

(73) Assignees: Kabushiki Kaisha Toshiba, Minato-Ku, Tokyo (JP); Toshiba Medical Systems Corporation, Otawara-Shi, Tochigi (JP)

( * ) Notice: Subject to any disclaimer, the term of this patent is extended or adjusted under 35 U.S.C. 154(b) by 240 days.

(21) Appl. No.: 12/112,499

(22) Filed: Apr. 30, 2008

(65) Prior Publication Data
US 2008/0272783 A1    Nov. 6, 2008

(30) Foreign Application Priority Data

May 1, 2007    (JP) .................................. 2007-121061

(51) Int. Cl.
*G01V 3/00*    (2006.01)
(52) U.S. Cl. ........................................ 324/318; 324/322
(58) Field of Classification Search .................. 324/318, 324/322
See application file for complete search history.

(56) References Cited

U.S. PATENT DOCUMENTS

| | | | |
|---|---|---|---|
| 6,969,992 B2 * | 11/2005 | Vaughan et al. ............... | 324/318 |
| 6,982,554 B2 * | 1/2006 | Kurpad et al. ................. | 324/318 |
| 7,141,980 B2 * | 11/2006 | Belt et al. ....................... | 324/322 |
| 7,508,214 B2 * | 3/2009 | Misic ............................. | 324/322 |
| 7,535,230 B2 * | 5/2009 | Takagi ........................... | 324/318 |
| 2007/0229076 A1 | 10/2007 | Habara et al. | |

OTHER PUBLICATIONS

Junge S. et al., "Current Sheet Antenna Array—A Transmit/Receive Surface Coil Array for MRI at High Fields", Proc. Intl. Soc. Mag. Reson. Med., vol. 11, 1 page, (2004).
Katscher, U., et al., "Transmit SENSE," Magnetic Resonance in Medicine 49: 144-150 (2003).

* cited by examiner

*Primary Examiner* — Louis M Arana
(74) *Attorney, Agent, or Firm* — Nixon & Vanderhye PC

(57) ABSTRACT

A magnetic resonance imaging apparatus that applies a gradient magnetic field and a radio-frequency magnetic field to a subject in a static magnetic field to image the subject based on magnetic resonance signals emitted from the subject, includes a unit which generates K transmission radio-frequency pulse signals required to produce the radio-frequency magnetic field, an allocation unit which allocates the K transmission radio-frequency pulse signals to K in M transmission signal paths, a connection unit to which at most M radio-frequency coils are attachable and which selectively connects the M transmission signal paths and M reception signal paths to the radio-frequency coils, a selection unit which selects N in magnetic resonance signals which are respectively received by the at most M radio-frequency coils and transmitted through the at most M reception signal paths, and a unit which performs reception processing for each of the selected N magnetic resonance signals.

11 Claims, 13 Drawing Sheets

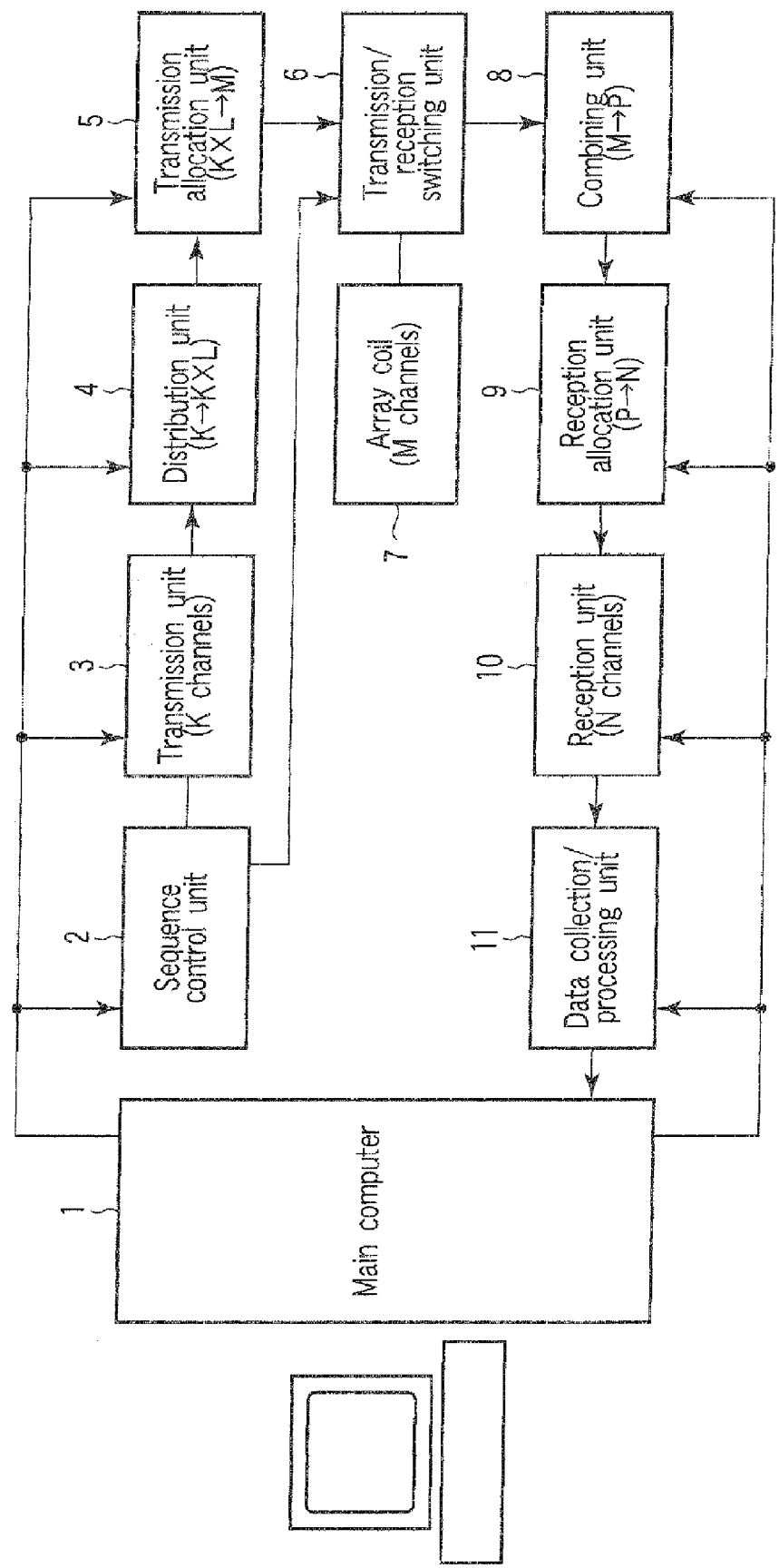
F I G. 1

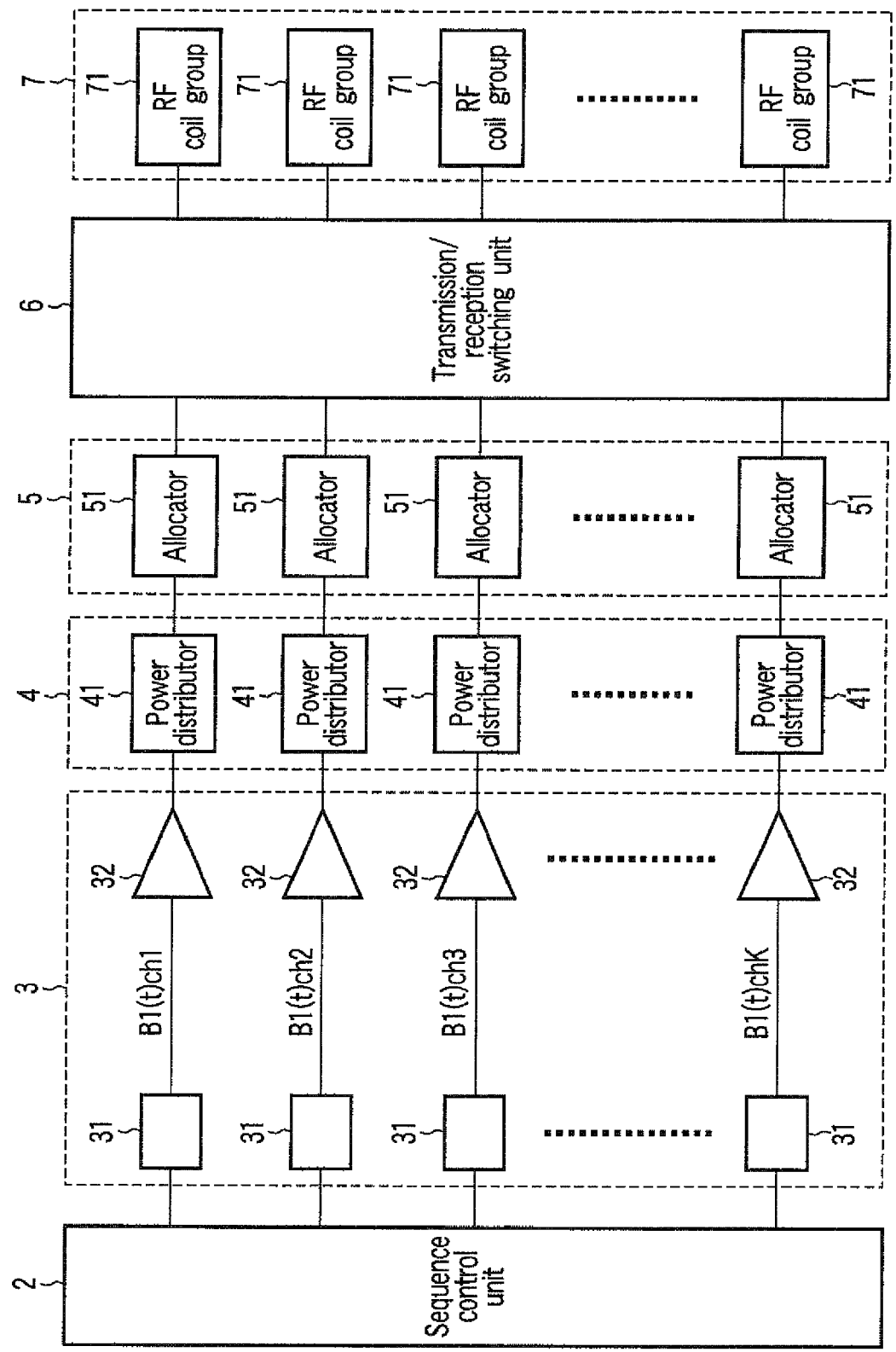
F I G. 5

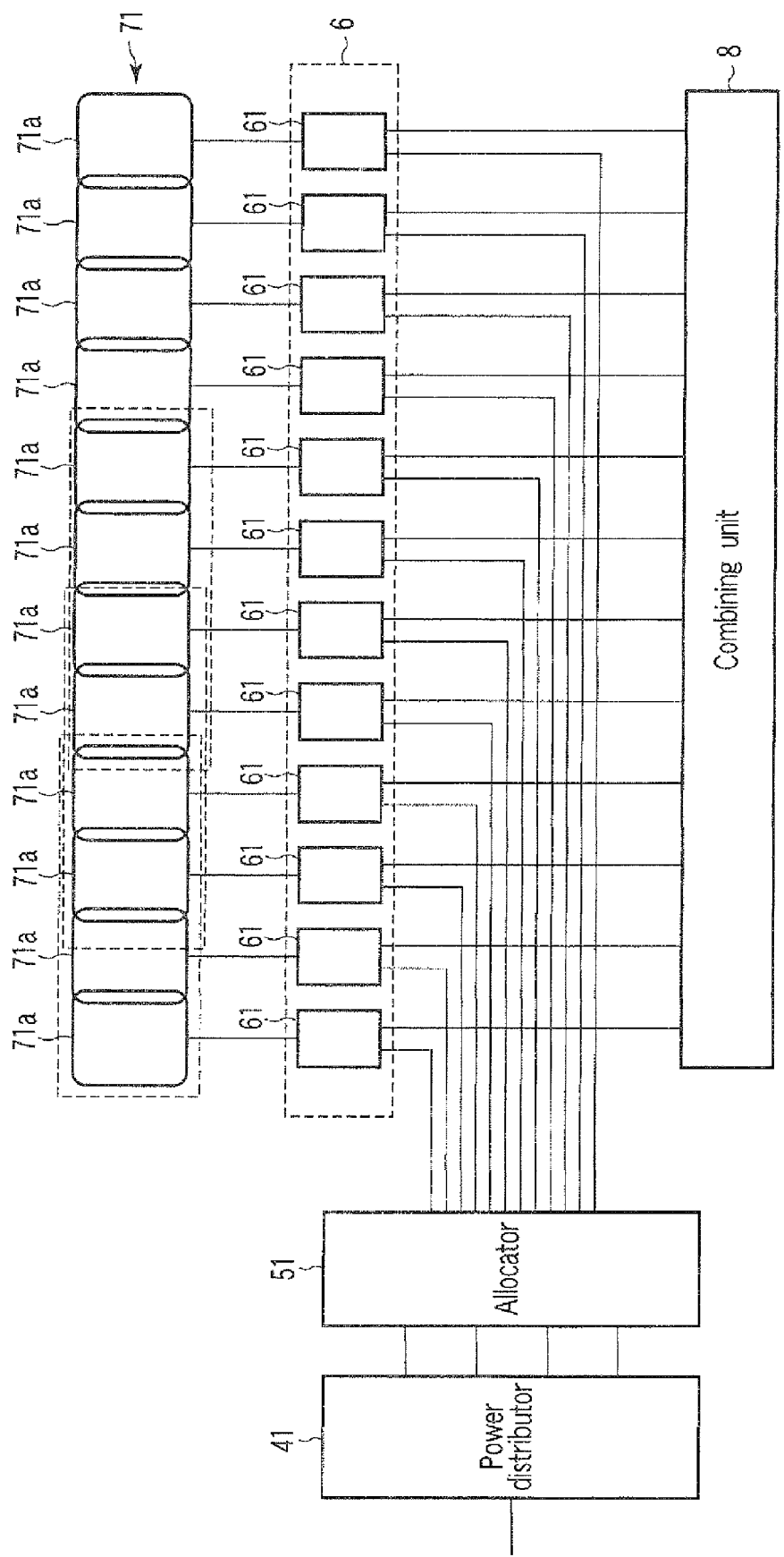
F I G. 6

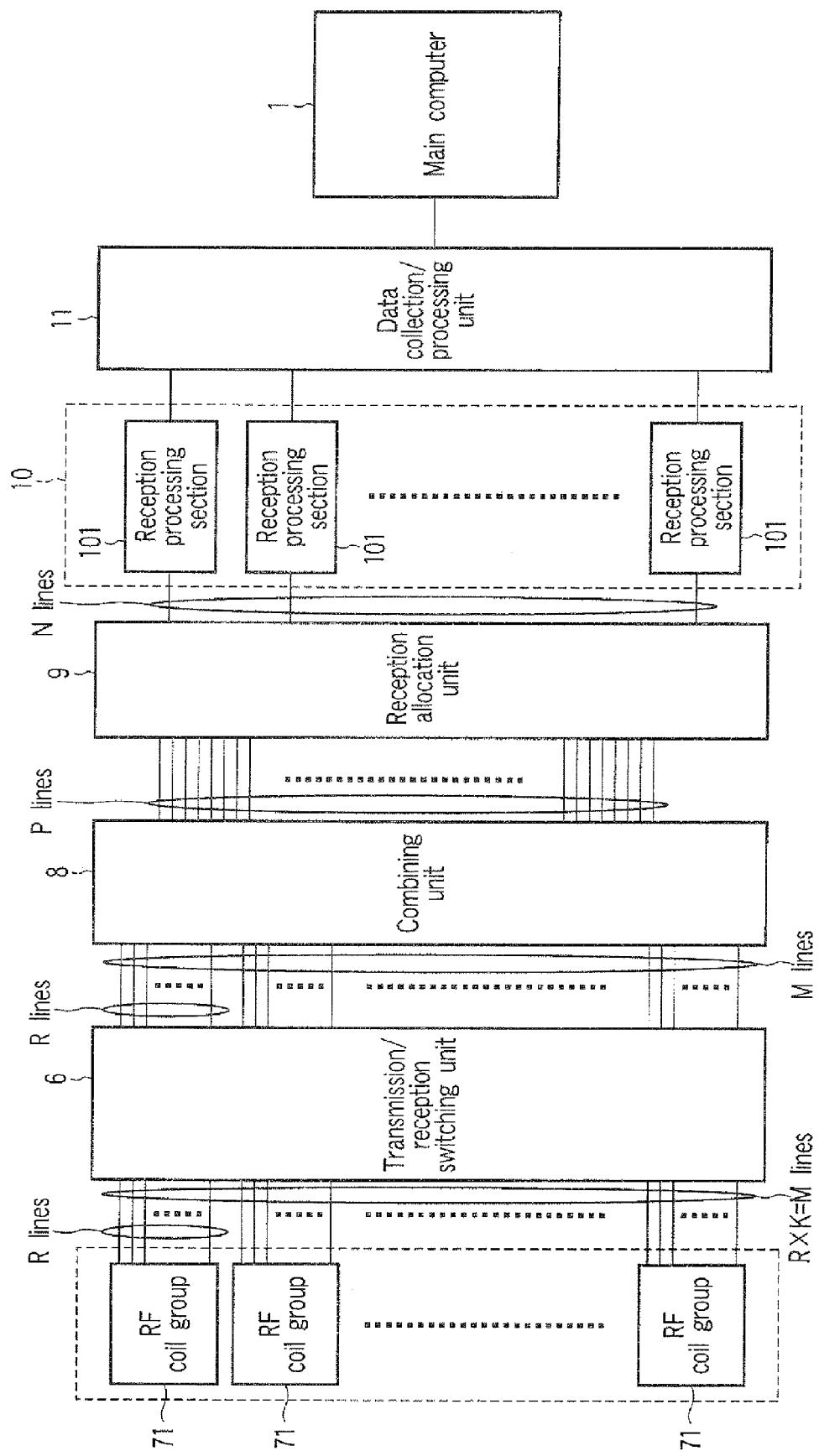
F I G. 7

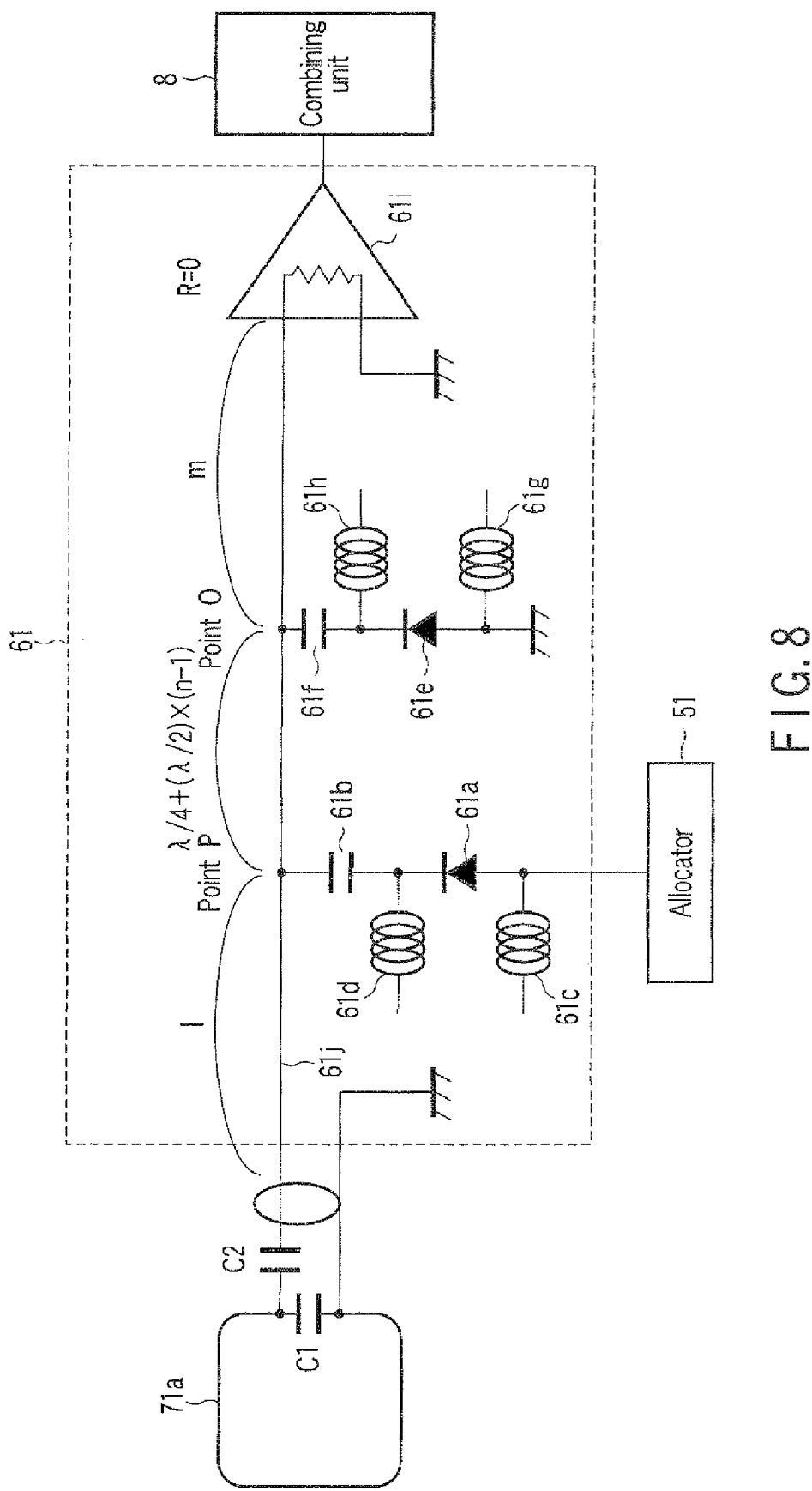
F I G. 8

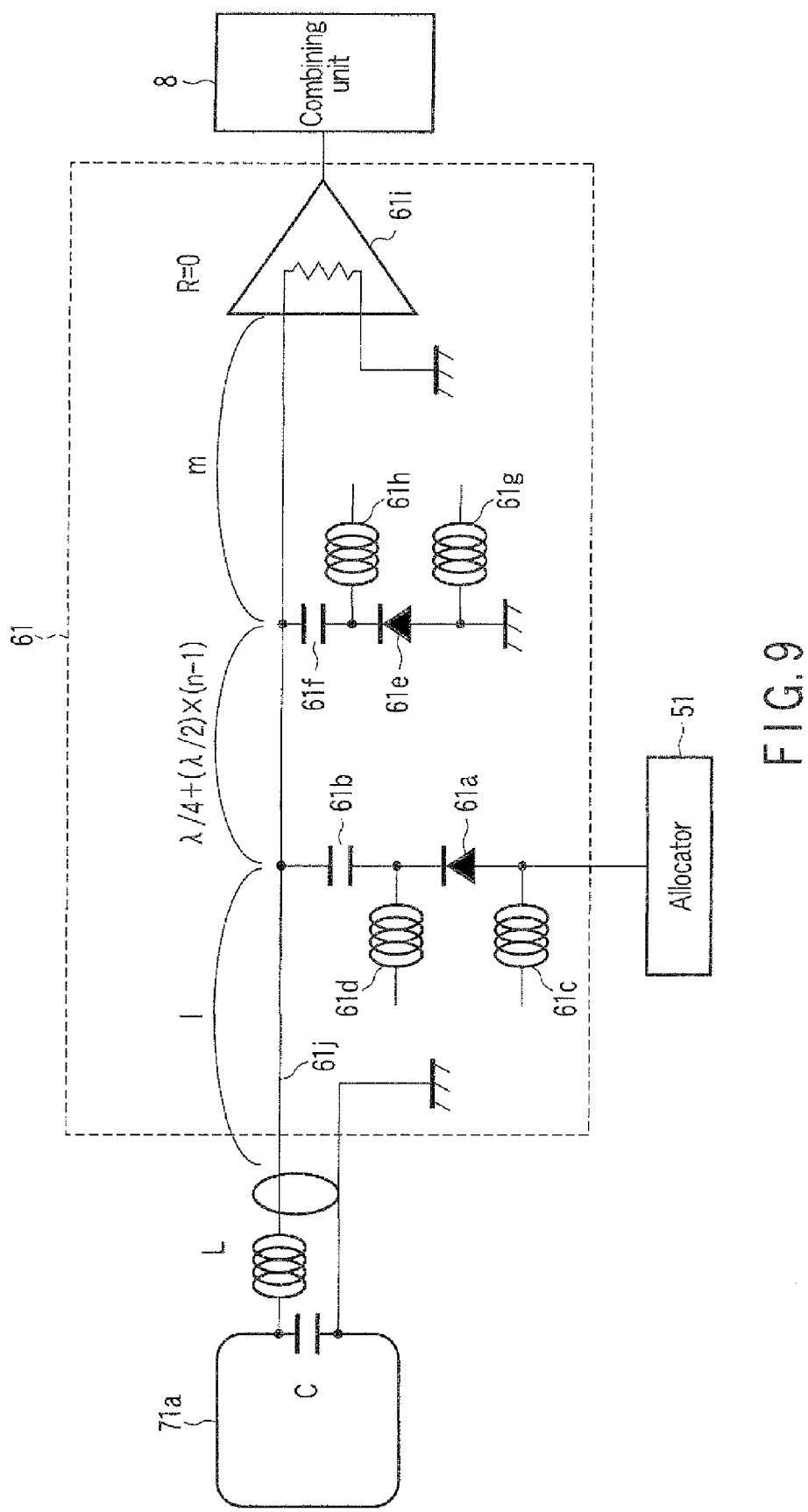
F I G. 9

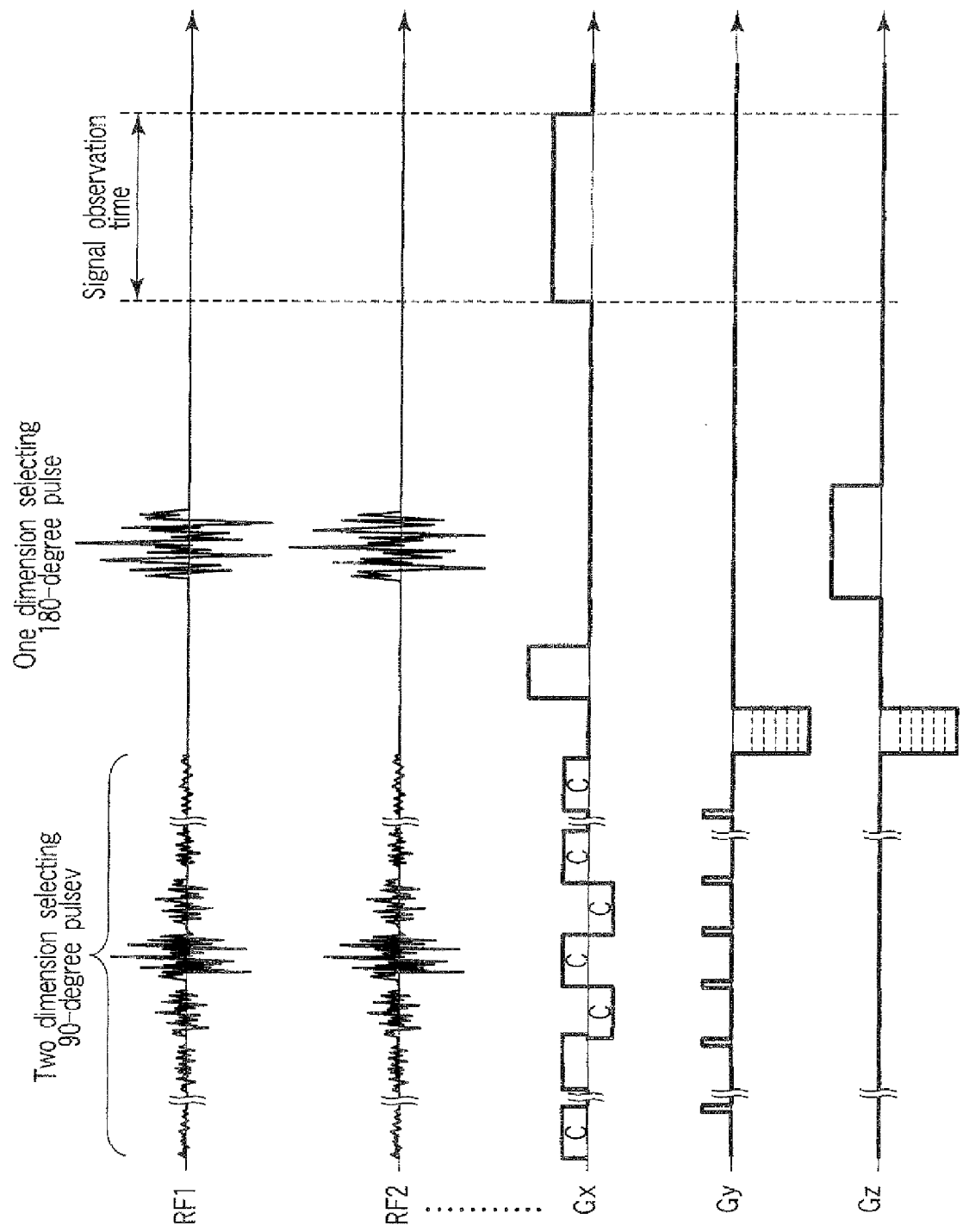
F I G. 15

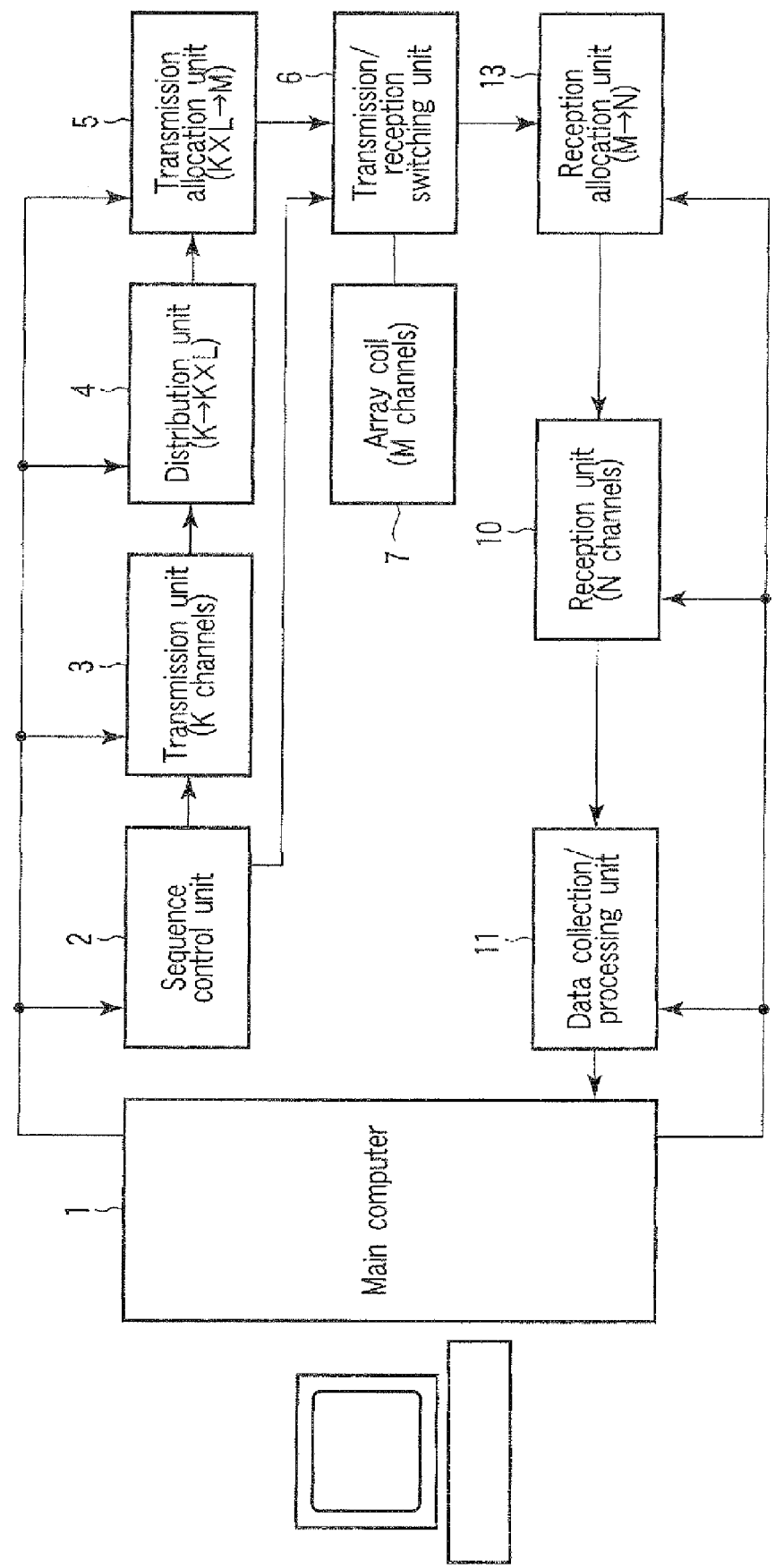
F I G. 17

MAGNETIC RESONANCE IMAGING APPARATUS AND MAGNETIC RESONANCE IMAGING METHOD

CROSS-REFERENCE TO RELATED APPLICATIONS

This application is based upon and claims the benefit of priority from prior Japanese Patent Application No. 2007-121061, filed May 1, 2007, the entire contents of which are incorporated herein by reference.

BACKGROUND OF THE INVENTION

1. Field of the Invention

The present invention relates to a magnetic resonance imaging apparatus (which will be referred to as an MRI apparatus hereinafter) and a magnetic resonance imaging method that perform imaging of a subject based on a magnetic resonance signal generated in the subjected by applying a gradient magnetic field and a radio-frequency pulse to the subject in a static magnetic field, and use a plurality of transmission/reception radio-frequency coils for transmission of the radio-frequency pulse and reception of the magnetic resonance signal.

2. Description of the Related Art

In recent years, development of parallel imaging has enabled imaging with less distortion at a high speed by an MRI apparatus. Further, the number of coils that can be used in the MRI apparatus or the number of reception channels included in the MRI apparatus tends to increase more and more.

On the other hand, as another tendency in recent years, a static magnetic field intensity is increasing. When the static magnetic field intensity increases, a magnetic resonance frequency rises. When the static magnetic field intensity is, e.g., 3 T, the magnetic resonance frequency is 128 MHz. A wavelength of a radio-frequency pulse becomes short due to such a rise in the magnetic resonance frequency, which results in a factor of nonuniformity of a radio-frequency magnetic field distribution in a living body and unevenness in sensitivity of an image. For example, as a transmission radio-frequency coil, a birdcage type coil having a uniform radio-frequency magnetic field distribution has been conventionally used. In this birdcage type coil, a transmission radio-frequency magnetic field becomes non-uniform due to an increase in frequency, and there occurs an inconvenience that image contrast or uniformity becomes insufficient.

To overcome this problem, a method using an array coil as a transmission coil attracts attention (see Katscher U et al: Transmit SENSE. Magn Reson Med 49: 144-150 (2003)). According to this method, radio-frequency magnetic fields having different amplitudes or phases are applied from respective array coils arranged to surround a subject, thereby realizing uniform excitation with respect to the subject.

On the other hand, the array coil has been already used as a reception coil. When using a transmission array coil separately from such a reception array coil, both the transmission array coil and the reception array coil must be disposed in a gantry, around a subject, or to a bed.

Further, when using different array coils for transmission and reception, a large transmission array coil that can cover a subject and a reception array coil is prepared. Moreover, in this case, a large transmission power is required, which is not economical. Furthermore, applying a radio frequency to a wide region of the subject may possibly lead to an increase in a specific absorption rate (SAR) of the subject. That is, applying the radio-frequency magnetic field only to a region that should be imaged is desirable, but this is difficult to be realized in the above-explained structure.

Using the transmission array coil and the reception array coil as explained above results in occurrence of various inconveniences.

Moreover, using the large transmission coil that can cover the large region to enable imaging at various positions in a wide region results in occurrence of various inconveniences.

Thus, enabling one array coil to be used for both transmission and reception is naturally desired, but a magnetic resonance imaging apparatus that realizes this structure is unknown.

Additionally, enabling changing a region to which a radio-frequency magnetic field is applied by the transmission coil is desired, but a magnetic resonance imaging apparatus that realizes this structure is not known.

BRIEF SUMMARY OF THE INVENTION

According to a first aspect of the present invention, there is provided a magnetic resonance imaging apparatus that applies a gradient magnetic field and a radio-frequency magnetic field to a subject in a static magnetic field to image the subject based on magnetic resonance signals emitted from the subject, comprising: a unit which generates K (K is a natural number greater than or equal to 2) transmission radio-frequency pulse signals required to produce the radio-frequency magnetic field; an allocation unit which allocates the K transmission radio-frequency pulse signals to K in M (M is a natural number greater than or equal to 2, and M≧K) transmission signal paths; a connection unit to which at most M radio-frequency coils are attachable and which selectively connects the M transmission signal paths and M reception signal paths to the radio-frequency coils; a selection unit which selects N (N is a natural number greater than or equal to 2, and N≦M and N>K) in magnetic resonance signals which are respectively received by the at most M radio-frequency coils and transmitted through the at most M reception signal paths; and a unit which performs reception processing for each of the selected N magnetic resonance signals.

According to a second aspect of the present invention, there is provided a magnetic resonance imaging apparatus that applies a gradient magnetic field and a radio-frequency magnetic field to a subject in a static magnetic field to image the subject based on magnetic resonance signals emitted from the subject, comprising: a unit which generates K (K is a natural number greater than or equal to 2) transmission radio-frequency pulse signals required produce the radio-frequency magnetic field; an allocation unit which allocates the K transmission radio-frequency pulse signals to K in M (M is a natural number greater than or equal to 2, and M≧K) transmission signal paths; a unit which determines one or more of the at most M radio-frequency coils for transmission; and a unit which controls the allocation unit in such a manner that the transmission radio-frequency pulse signals are supplied to the one radio-frequency coil or the plurality of radio-frequency coils determined for transmission.

According to a third aspect of the present invention, there is provided a magnetic resonance imaging method using a magnetic resonance imaging apparatus that includes a connection unit to which at most M radio-frequency coils are attachable and which selectively connects the M (M is a natural number greater than or equal to 2) transmission signal paths and M reception signal paths to the radio-frequency coils, and applies a gradient magnetic field and a radio-frequency magnetic field to a subject in a static magnetic field to image the subject based on magnetic resonance signals emitted from the subject, the method comprising: generating K (K is a natural number greater than or equal to 2) transmission radio-frequency pulse signals required to generate the radio-frequency magnetic field; allocating the K transmission radio-frequency pulse signals to K in the M transmission signal paths; selecting N (N is a natural number greater than or equal to 2, and N≦N and N>K) in the magnetic resonance signals that are received by the at most M radio-frequency coils and transmitted through the at most M reception signal paths; and receiving the selected N magnetic resonance signals.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

FIG. 1 is a block diagram showing a structure of a primary part in an MRI apparatus according to an embodiment of the present invention;

FIG. 5 is a view showing a detailed structure of a transmission system in the MRI apparatus depicted in FIG. 1;

FIG. 6 is a view showing a detailed structure of a transmission/reception switching unit 6 depicted in FIG. 1;

FIG. 7 is a view showing a detailed structure of a reception system in the MRI apparatus depicted in FIG. 1;

FIG. 8 is a circuit diagram of a transmission/reception switcher 61 depicted in FIG. 6;

FIG. 9 is a circuit diagram of the transmission/reception switcher 61 depicted in FIG. 6;

FIG. 13 is a view showing an example of a positional relationship between the FOV and an RF coil 71a;

FIG. 15 is a view showing an example of a pulse sequence when using the plurality of RF coils 71a required to obtain a three-dimensional FOV;

FIG. 17 is a block diagram showing a modified structural example of the primary part in the MRI apparatus according to an embodiment of the present invention.

DETAILED DESCRIPTION OF THE INVENTION

Figure 2:
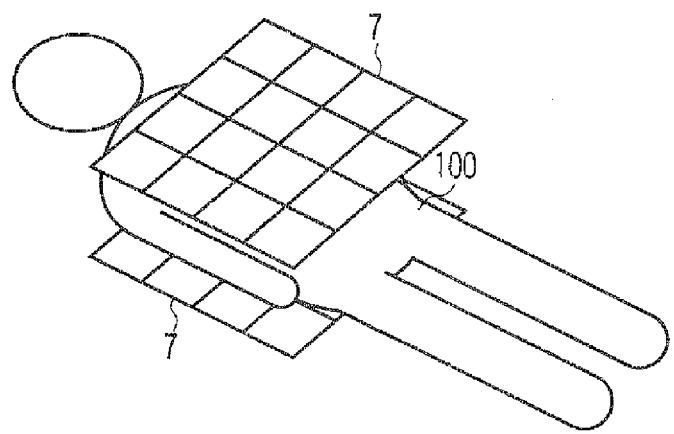
FIG. 2 is a perspective view showing an example of a use status of array coils 7 depicted in FIG. 1.

An embodiment according to the present invention will now be explained hereinafter with reference to the accompanying drawings.

Before giving a specific description on the embodiment, a technical background that should be considered in this embodiment will now be explained.

In regard to reception, 8 to 32 channels or more channels are required because of a demand for realization of a speed increasing rate based on an SNR (signal-to-noise ratio) or parallel imaging to be expected. On the other hand, in regard to transmission, the smaller number of channels than that required in reception are used since the number of channels equivalent to that required in reception is not necessary in order to realize uniform excitation with respect to a subject or a transmission RF amplifier is expensive. That is, assuming that K is the number of transmission channels, M is the number of radio-frequency coils to be disposed, and N is the number of reception channels, relationships N≦M, M≧K, and K<N are achieved.

FIG. 1 is a block diagram showing a structure of a primary part in an MRI apparatus according to this embodiment.

The MRI apparatus depicted in FIG. 1 includes a main computer 1, a sequence control unit 2, a transmission unit 3, a distribution unit 4, a transmission allocation unit 5, a transmission/reception switching unit 6, an array coil 7, a combining unit 8, a reception allocation unit 9, a reception unit 10, and a data collection/processing unit 11. Besides, this MRI apparatus also includes a gantry provided with a static magnetic field magnet or a gradient magnetic field coil as well known or a bed on which a subject is mounted, but these structures are known, and hence they are omitted in the drawing.

The main computer 1 collectively controls respective sections in the MRI apparatus to realize various known functions included in a existing MRI apparatus.

The sequence control unit 2 controls the respective sections in the MRI apparatus to perform an operation for imaging in a predetermined sequence. The sequence control unit 2 supplies waveforms of transmission radio-frequency pulse signals (which will be referred to as transmission pulse signals hereinafter) of K channels or pulse information indicative of a frequency to the transmission unit 3. This pulse information may be supplied to the transmission unit 3 as either an analog signal or digital data.

The transmission unit 3 generates transmission pulse signals of the K channels based on the pulse information, and supplies the generated signals to the distribution unit 4 in parallel.

The distribution unit 4 distributes the transmission pulse signals of the K channels to L, thereby obtaining K×L transmission pulse signals. The distribution unit 4 supplies the K×L transmission pulse signals to the transmission allocation unit 5 in parallel.

The transmission allocation unit 5 is connected with the transmission/reception switching unit 6 through M signal lines. The transmission allocation unit 5 allocates some or the K×M transmission pulse signals to any one of the M signal lines, and outputs such signals to this signal line.

The transmission/reception switching unit 6 switches a state where the array coil 7 is used to perform transmission and a state where the array coil 7 is used to perform reception.

One or more array coils 7 (FIGS. 2-3) are attached to a subject or a bed. Each of the one or more array coils 7 includes a plurality of built-in radio-frequency coils (RF coils). Furthermore, at most M RF coils in the RF coils provided in the array coil 7 can be connected with the transmission/reception switching unit 6. When the M transmission pulse signals fed from the transmission/reception switching unit 6 are supplied, the RF coils in the array coil 7 emit radio frequency pulses. Furthermore, the array coil 7 converts the magnetic resonance signal in an electromagnetic wave state emitted from the subject into a magnetic resonance signal in an electrical signal state. The array coil 7 supplies the magnetic resonance signal obtained by the RF coils connected with the transmission/reception switching unit 6 to the transmission/reception switching unit 6 in parallel.

The combining unit 8 supplies P combined signals obtained by combining Q magnetic resonance signals to the reception allocation unit 9. It is to be noted that $P \geq N$ is achieved. It is to be noted that the Q magnetic resonance signals to be combined may be received by Q RF coils 71a (FIG. 4) included in the same RF coil group 71 or may be received by the Q RF coils 71a aligned in a direction crossing a body axis direction.

The reception allocation unit 9 is connected with the reception unit 10 through N signal lines. The reception allocation unit 9 selects N combined signals from the P combined signals. The reception allocation unit 9 allocates the N combined signals to the N signal lines and outputs the allocated signals to the signals lines. Incidentally, it is usually often the case that an irradiation range of the transmission pulse signal is equal to an imaging range, and $N=K \times L$ is achieved in this case.

The reception unit 10 performs reception processing for each of the N combined signals in parallel, and supplies the N combined signals subjected to processing to the data collection/processing unit 11.

The data collection/processing unit 11 collects the N combined signals, and reconfigures an image based on these collected signals.

It is to be noted that each of the variables K, L, M, N, P, and Q represents a maximum number each unit can take for an operating state where the smaller number of signals than each of these variables are enabled.

Figure 3:
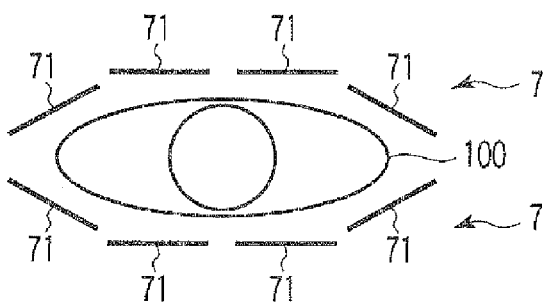
FIG. 3 is a perspective view showing an example of a use status of the array coils 7 depicted in FIG. 1.

FIGS. 2 and 3 are perspective views showing an example of a use status of the array coils 7.

In the example depicted in FIGS. 2 and 3, the two array coils 7 are arranged on an abdominal side and a back side of a subject 100, respectively. The array coils 7 can be bent as shown in FIG. 3, and they are arranged along a body surface of the subject 100.

Figure 4:
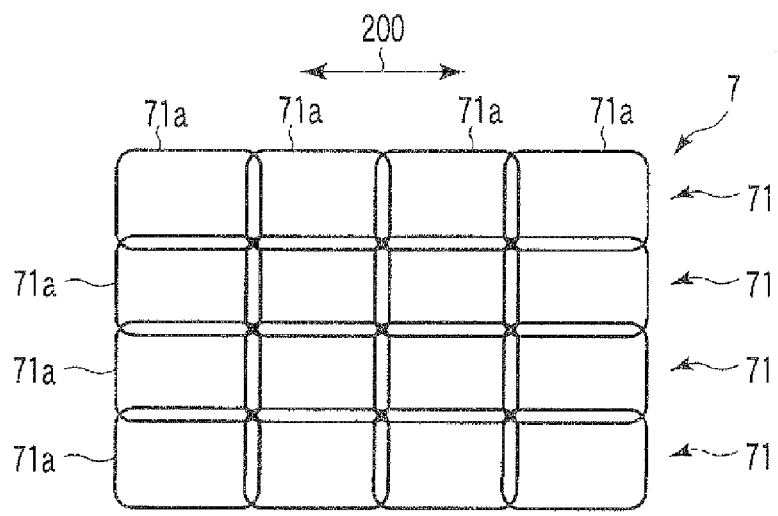
FIG. 4 is a view showing a structure of the array coil 7 depicted in FIG. 1.

FIG. 4 is a view showing a structure of the array coil 7.

As shown in FIG. 4, the array coil 7 is configured by arranging 16 RF coils 71a in a 4×4 matrix. The array coil 4 is used in a state where a direction indicated by an arrow 200 matches the body axis direction of the subject. Usually, the body axis direction of the subject matches a static magnetic field direction (a Z axis direction). That is, the direction indicated by the arrow 200 usually matches the Z axis direction. A group of the plurality of RF coils 71a aligned in the direction indicated by the arrow 200 will be referred to as an RF coil group 71 hereinafter. It is to be noted that the plurality of array coils 7 may be aligned in the direction indicated by the arrow 200. In this case, all the RF coils 71a aligned in the direction indicated by the arrow 200 belong to the same RF coil group 71 irrespective of the array coil 7 to which these coils belong.

FIG. 5 is a view showing a detailed structure of a transmission system in the MRI apparatus depicted in FIG. 1. FIG. 6 is a view showing a detailed structure of the transmission/reception switching unit 6.

The transmission unit 3 includes K amplitude/phase control units 31 and K transmission amplifiers 32. The distribution unit 4 includes K power distributors 41. The transmission allocation unit 5 includes K allocators 51.

Each amplitude/phase control unit 31, each transmission amplifier 32, each power distributor 41, and each allocator 51 are connected in series as shown in FIG. 5, thereby constituting transmission processing systems for K channels.

Respective pieces of pulse information for the K channels fed from the sequence control unit 2 are supplied to the K amplitude/phase control units 31. The amplitude/phase control unit 31 generates a radio-frequency pulse having an amplitude and a phase controlled to have a waveform or a frequency indicated in the input pulse information.

The transmission amplifier 32 amplifies each radio-frequency pulse generated in the amplitude/phase control unit 31 to a level suitable for exciting a spin in the subject, thereby obtaining a transmission pulse signal.

The power distributor 41 distributes the transmission pulse signal amplified in the transmission amplifier 32 to a plurality of signals. It is to be noted that a division number in the power distributor 41 is four. The power distributor 41 can also output one of four outputs as it is, without distributing the transmission pulse signal. The main computer 1 instructs one of these two states to be used.

The allocator 51 outputs the four transmission pulse signals distributed by the power distributor 41 to at most four in the many transmission/reception switchers 61 included in the transmission/reception switching unit 6 as shown in FIG. 6. As the allocator 51, a matrix switch can be used, for example. The number of the transmission/reception switchers 61 connected with the single allocator 51 is the same as the number R of the RF coils 71a allowed to be included in one RF coil group 71. In FIG. 6, at most three array coils 7 are allowed to be aligned and used in the body axis direction, and a structure where R=12 is shown. Therefore, in FIG. 6, the 12 transmission/reception switchers 61 are connected with one allocator 51.

It is to be noted that FIG. 6 shows one transmission system alone, and other transmission systems are likewise configured, but they are omitted in the drawing. Therefore, the transmission/reception switching unit 6 includes a total of R×K transmission switchers 61. It is to be noted that R×K=M is achieved.

The R transmission/reception switchers 61 connected with the same allocator 51 are connected with at most R RF coils 71a belonging to the same RF coil group 71, respectively. Further, all the transmission/reception switchers 61 are connected with the combining unit 8. Therefore, three signal lines connected with the allocator 51, the combining unit 8, and the RF coil 71a are connected with each transmission/reception switcher 61. Furthermore, the transmission/reception switcher 61, achieves electrical conduction between a signal line connected with the allocator 51 and a signal line connected with the RF coil 71a in a transmission period, and attains electrical conduction between a signal line connected with the combining unit 8 and the signal line connected with the RF coil 71a in a reception period.

FIG. 7 is a view showing a detailed structure of a reception system in the MRI apparatus depicted in FIG. 1.

All the RF coils 71a included in at most K RF coil groups 71 can be connected with the combining unit 8 through the transmission/reception switchers 61 as depicted in FIG. 6. That is, M signal lines are connected with the combining unit 8. The combining unit 8 combines some, i.e., Q of magnetic resonance signals transmitted through the M signal lines, and supplies them as P combined signals to the reception allocation unit 9. It is to be noted that the combining unit 8 receives actual magnetic resonance signals as some (or only one) of the Q magnetic resonance signals, determines other signals as null signals, and performs combining processing. As a result, it can output a combined signal obtained by combining the smaller number of the magnetic resonance signals than Q, or can directly output one magnetic resonance signal as a combined signal.

The reception allocation unit 9 supplies N combined signals in the P combined signals to the reception unit 10 in parallel. As the reception allocation unit 9, a matrix switch can be used, for example.

The reception unit 10 includes N reception processing sections 101. The N combined signals supplied from the reception allocation unit 9 are input to the N reception processing sections 101, respectively. The reception processing sections 101 execute reception processing with respect to the combined signals input thereto, and supplies the N combined signals subjected to processing to the data collection/processing unit 11 in parallel.

FIG. 8 is a circuit diagram of the transmission/reception switcher 61.

The transmission/reception switcher 61 depicted in FIG. 8 includes a pin diode 61a, a capacitor 61b, coils 61c and 61d, a pin diode 61e, a capacitor 61f, coils 61g and 61h, and a pre-amplifier 61i.

The transmission/reception switcher 61 having a structure depicted in FIG. 8 is adapted to a situation where an impedance of the RF coil 71a is adjusted by a tuning capacitor C1 and a matching capacitor C2. It is to be noted that the impedance of the RF coil 71a is adjusted to, e.g., 50Ω. Moreover, the matching capacitor C2 is connected with the pre-amplifier 61i through a cable 61j. As the cable, a coaxial line of 50Ω is used, for example.

An anode of the pin diode 61a is connected with the allocator 51, and a cathode of the same is connected with one end of the capacitor 61b. The other end of the capacitor 61b is connected with the cable 61j at a point P. The coil 61c has one end connected with the anode of the pin diode 61a. The coil 61d has one end connected with the cathode of the pin diode 61a.

An anode of the pin diode 61e is grounded, and a cathode of the same is connected with one end of the capacitor 61f. The other end of the capacitor 61f is connected with the cable 61j at a point O. The coil 61g has one end connected with the anode of the pin diode 61e. The coil 61h has one end connected with the cathode of the pin diode 61e.

An input end of the pre-amplifier 61i is connected with the cable 61j, and an output end of the same is connected with the combining unit 8. The pre-amplifier 61i amplifies the magnetic resonance signal that is received by the RF coil 71a and input through the cable 61j, and then supplies this signal to the combining unit 8. An input impedance of the pre-amplifier 61i is substantially zero or at most several ohms.

A length between the point P and the point O in the cable 61j is $[\lambda/4+(\lambda/2)\times(n-1)]$. In this expression, $\lambda$ is a wavelength of a magnetic resonance frequency, and n is an integer.

It is to be noted that l and m are adjusted in such a manner that a cable length $[l+m+\lambda/4+(\lambda/2)\times(n-1)]$ and the capacitors C1 and C2 are resonated at a desired frequency.

It is to be noted that the impedance of the RF coil 71a may be adjusted by a capacitor C and an inductor L as shown in FIG. 9 in some cases, and the transmission/reception switcher 61 is realized by the same circuit as that in FIG. 8 as shown in FIG. 9 in this case. l and m are adjusted in such a manner that the cable length, the capacitor C, and the inductor L are resonated at a desired frequency like FIG. 8.

An operation of the thus configured MRI apparatus will now be explained.

(1) Switching of Transmission and Reception:

First, in the transmission period, a current flows through the pin diode 61a via the coils 61c and 61d and, at the same times a current flows through the pin diode 61e via the coils 61g and 61h. Then, the pin diode 61a is turned on, and the allocator 51 is thereby electrically connected with the cable 61j. On the other hand, when the pin diode 61e is turned on, the point O is short-circuited. Therefore, an impedance on the pre-amplifier side as seen from the point P that is λ/4 distanced from the point O is increased. As a result, almost all of a power of a transmission pulse signal fed from the allocator 51 is supplied to the RF coil 71a side.

In the reception period, a backward voltage is applied to each of the pin diodes 61a and 61e through the coils 61c and 61d and the coils 61g and 61h. Then, the pin diodes 61a and 61e are turned off, and the allocator 51 is thereby electrically disconnected from the cable 61j. As a result, almost all of a power of a magnetic resonance signal received by the RF coil 71a is input to the pre-amplifier 61i.

(2) Transmitting Operation:

In general, when an FOV (field of view) is a restricted region in a sensitivity region of the array coil 7, using the RF coils 71a alone which have the inside of the FOV and its periphery as a sensitivity region is desirable in order to reduce an SAR (specific absorption rate).

Thus, the main computer 1 automatically determines the RF coils 71a that should be used to transmit transmission radio-frequency pulse signals while considering a positional relationship between the FOV and the RF coils 71a. Alternatively, the main computer 1 determines the RF coils 71a that should be used to transmit transmission radio-frequency pulse signals in accordance with a specification by a user.

Figure 10:
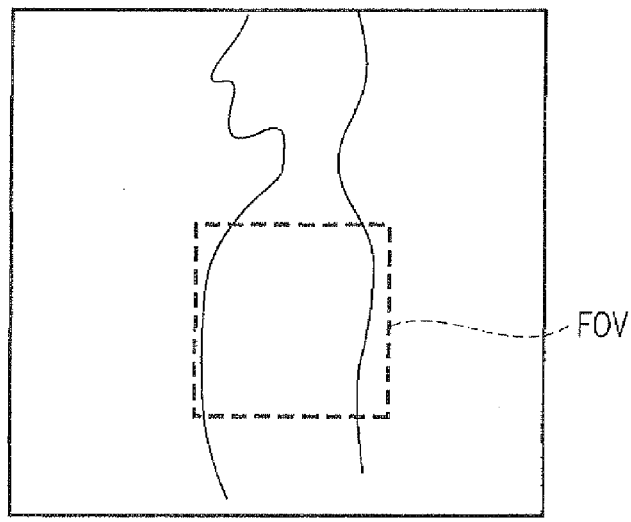
FIG. 10 is a view showing an example of a setting status of an FOV.
Figure 11:
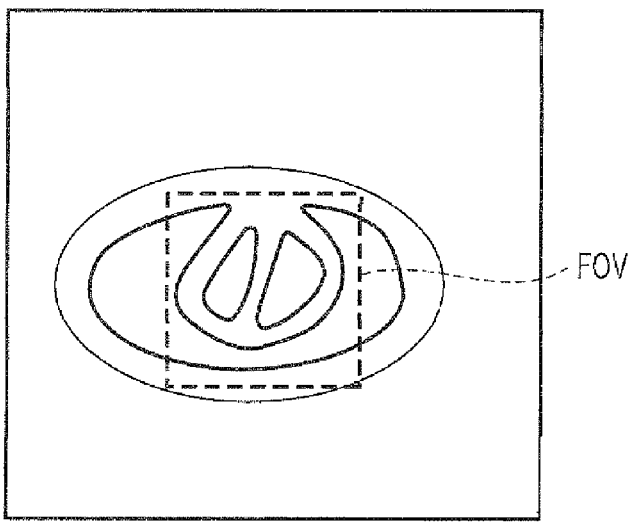
FIG. 11 is a view showing an example of a setting status of the FOV.
Figure 12:
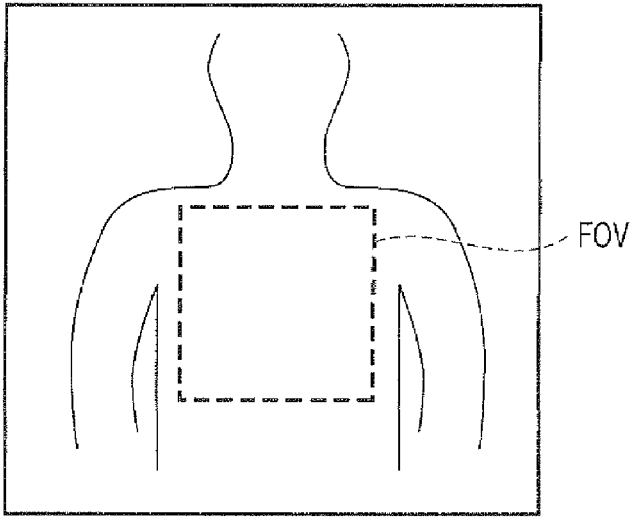
FIG. 12 is a view showing an example of a setting status of the FOV.
Figure 13:
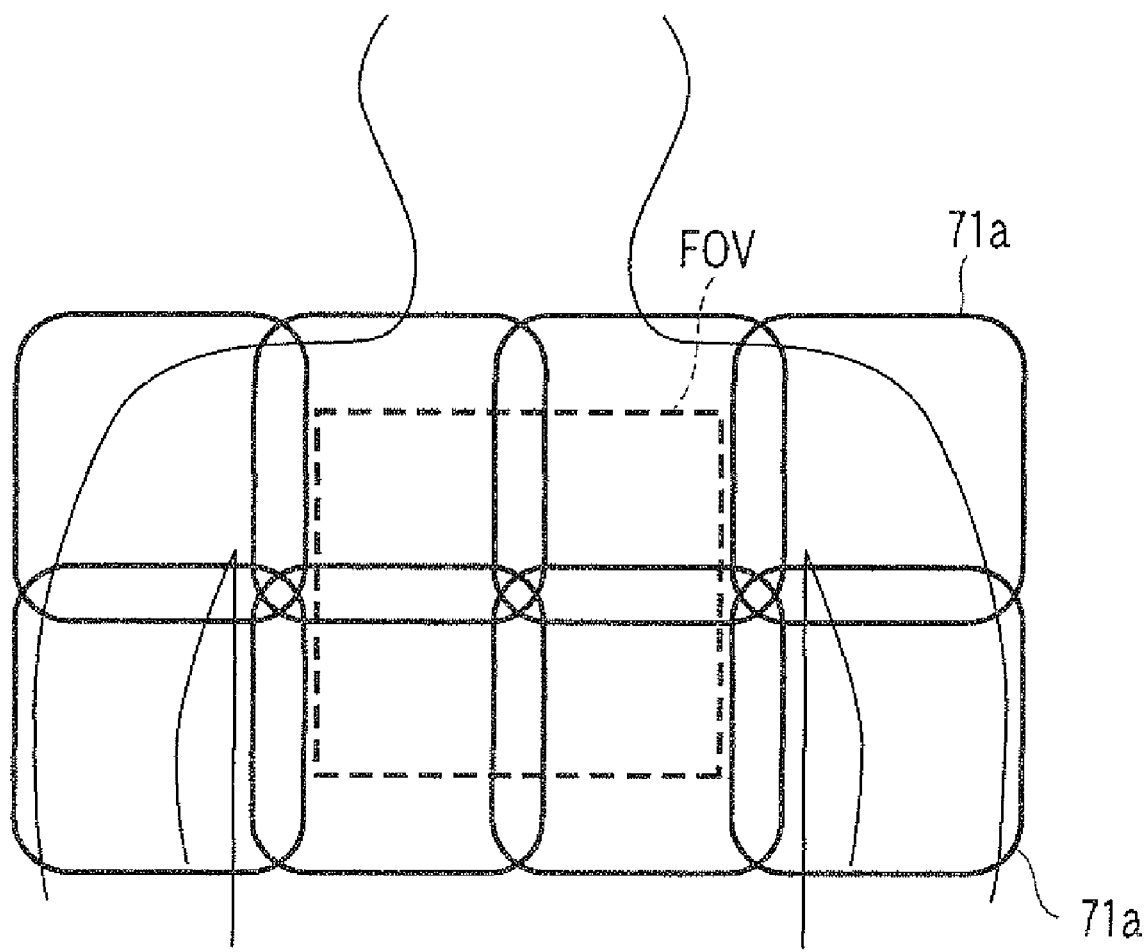

For example, it is assumed that such a three-dimensional FOV as indicated by broken lines in FIGS. 10 and 12 is set in each of a sagittal surface, an axial surface, and a coronal surface. Furthermore, when the FOV and the RF coils 71a have a positional relationship depicted in FIG. 13, the four RF coils 71a at the center in FIG. 13 are determined as coils that should be used to transmit the transmission radio-frequency pulse signals.

Moreover, the main computer 1 controls the transmission unit 3, the distribution unit 4, and the transmission allocation unit 5 so that transmission pulse signals can be supplied to the thus selected RF coils 71a.

Figure 14:
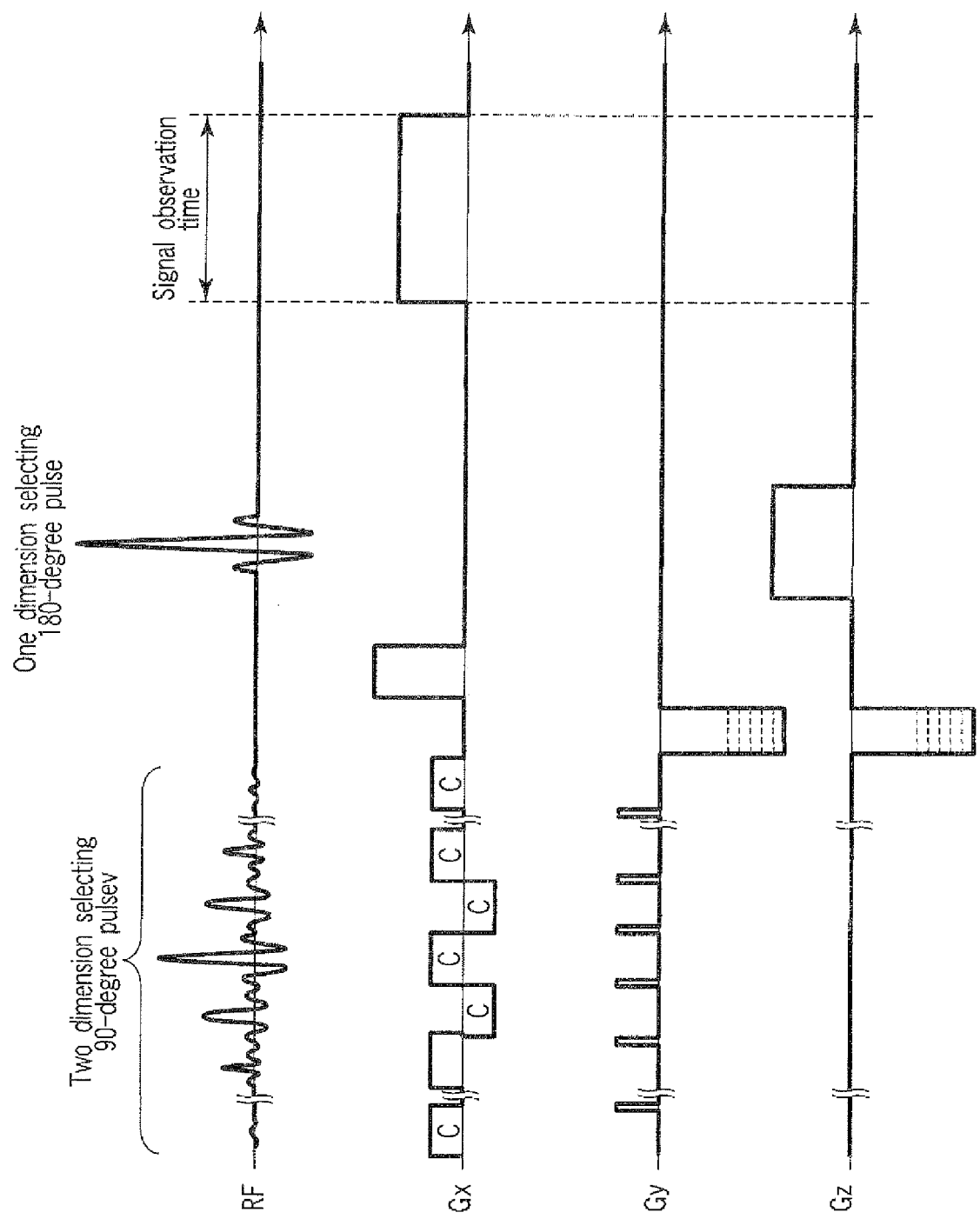
FIG. 14 is a view showing an example of a basic pulse sequence required to obtain a three-dimensional FOV.

When the plurality of RF coils 71a are used for transmission like this embodiment, such a technique of two-dimensional excitation as disclosed in, e.g., "Katscher U et al: Transmit SENSE. Magn Reson Med 49: 144-150 (2003)" is used. For example, a two-dimensional excitation sequence when using a spin echo method utilizes a 90-degree pulse that excites a two-dimensional region and a 180-degree pulse that excites a remaining one dimension as shown in FIG. 14. In this embodiment, a transmission pulse signal that is set for each RF coil 71a in accordance with an excitation region is applied to each RF coil 71a as shown in FIG. 15, for example.

At this time, a transmission pulse signal for one channel may be supplied to the plurality of RF coils 71a, or transmission pulse signals for different channels may be supplied to the plurality of RF coils 71a, respectively. Two specific examples of supply of the transmission pulse signal will now be explained.

(2-1) When Using One RF Coil 71a to Transmit Transmission Pulse Signal for One Channel:

The transmission pulse signal for one channel is supplied to the allocator 51 as it is, without being distributed by the power distributor 41. This one transmission pulse signal is selected by the allocator 51 and supplied to the necessary RF coil 71a through the transmission/reception switcher 61. The allocator 51 can supply the transmission pulse signal to all of the RF coils 71a included in the single RF coil group 71.

(2-2) When using four RF coils 71a to transmit transmission pulse signal for one channel:

The four transmission pulse signals distributed by the single power distributor 41 are supplied to, e.g., the four RF coils 71a adjacent to each other which are surrounded by a broken line in FIG. 6 through the transmission/reception switcher 61.

(3) Receiving Operation:

The combining unit 8 combines Q magnetic resonance signals belonging to each group with respect to each P group. At this time, the magnetic resonance signals received by the RF coils 71 required to cover an imaging region are used and the signals concerning the other RF coils 71a are not used for combining processing. At this time, the Q magnetic resonance signals belonging to one group do not have to be signals obtained by the RF coils 71a belonging to the same RF coil group 71. For example, the four magnetic resonance signals respectively obtained by the four RF coils 71a aligned in a direction perpendicular to the body axis direction may be combined.

The transmission/reception allocation unit 9 selects at most N combined signals from the combined signals obtained from the magnetic resonance signals received by the RF coils 71a required to cover the imaging region in the P magnetic resonance signals supplied from the combining unit 8, and supplies the selected signals to the reception processing section 101.

As explained above, according to this embodiment, the RF coils 71a that supply the smaller number of the transmission pulse signals than the number of the RF coils 71a can be changed. Therefore, it is possible to cope with various imaging states by using the transmission pulse signals for a small number of channels.

Additionally, according to this embodiment, positions and the number of the RF coils 71a used to transmit the transmission pulse signals for one channel can be changed. That is, a position and a size of an irradiation region of the transmission pulse signals for one channel can be changed.

It is to be noted that the two or three transmission pulse signal may be supplied to the two or three RF coils 71a.

Further, increasing the distribution number of the power distributor 41 enables executing finer control over application of the transmission pulse signals in a wider range or the irradiation region of the transmission pulse signals.

In this case, however, only a position or a size of the irradiation region in the body axis direction can be change based on the above-explained operation. However, the same operation can be performed by using the other RF coil groups 71 in regard to other channels, and whether the transmission pulse signals are to be supplied can be set in accordance with each channel. Therefore, a position and a size of a transmission region of the transmission pulse signals in a direction crossing the body axis direction can be also changed.

Furthermore, according to this embodiment, the magnetic resonance signals received by the RF coil 71a required to cover the imaging region in the many RF coils 71a can be supplied to the reception processing section 101. The reception system for a small number of channels can cope with various imaging states.

Moreover, according to this embodiment, the transmission pulse signals are allocated to the RF coils 71a before switching transmission/reception by the transmission/reception switching unit 6. Additionally, the magnetic resonance signals are allocated to the reception processing section 101 after switching transmission/reception. Therefore, although the number K of the channels in the transmission system is different from the number N of the channels in the reception system, the many RF coils 71a can be adequately used for both transmission and reception.

This embodiment can be modified in many ways as follows.

Figure 16:
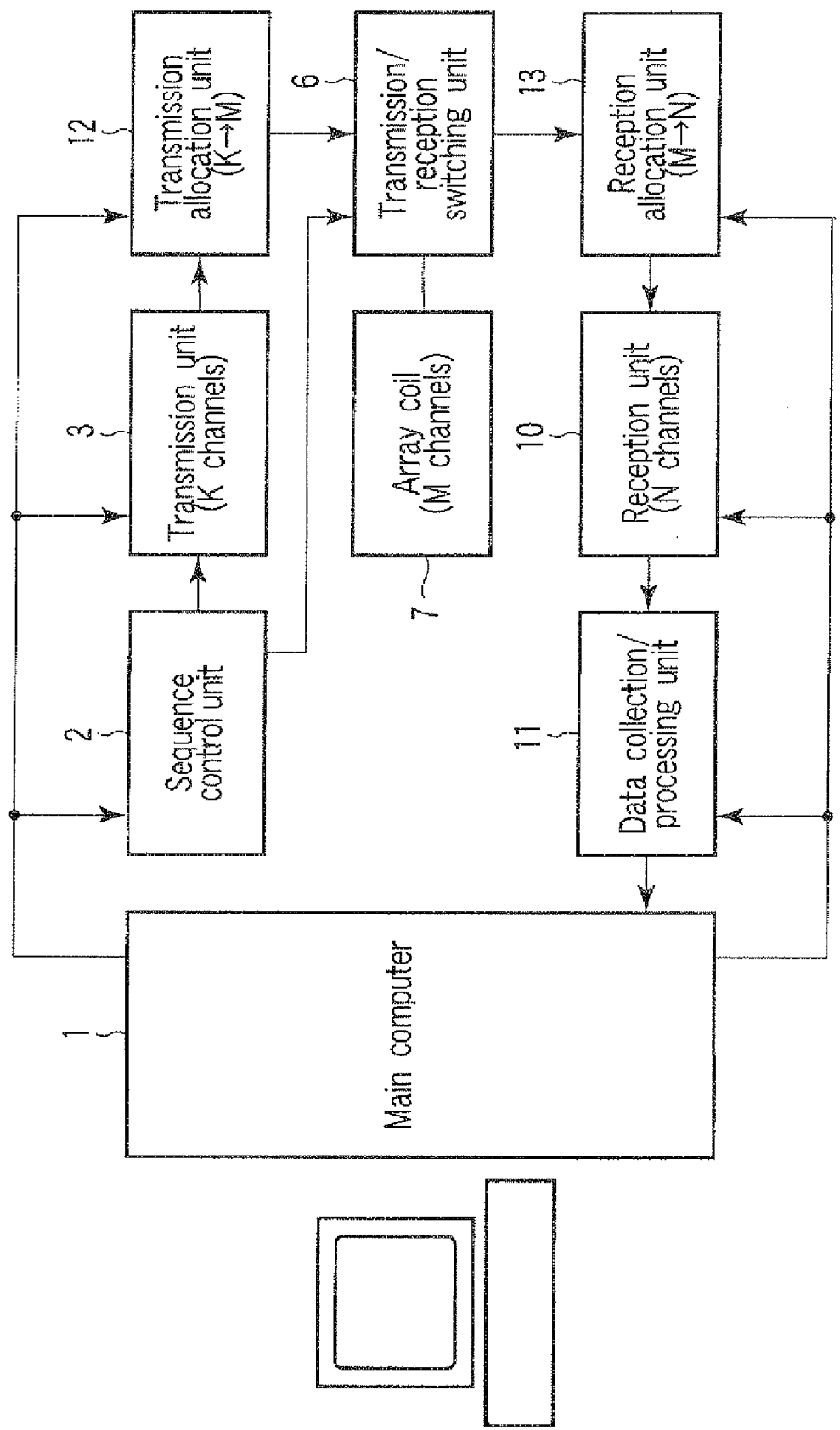
FIG. 16 is a block diagram showing a modified structural example of the primary part in the MRI apparatus according to an embodiment of the present invention.

(1) As shown in FIG. 16, the distribution unit 4 and the combining unit 8 may be omitted. However, in this case, a transmission allocation unit 12 is provided in place of the transmission allocation unit 5, and a reception allocation unit 13 is provided in place of the reception allocation unit 9. The transmission allocation unit 12 outputs transmission pulse signals for K channels generated by the transmission unit 3 to arbitrary K signal lines in the M signal lines, respectively. The reception allocation unit 9 selects and outputs N magnetic resonance signals in the P magnetic resonance signals, whereas the reception allocation unit 13 selects and outputs N magnetic resonance signals in the M magnetic resonance signals.

In this case, a size of the irradiation region of the transmission pulse signals cannot be changed, or the number of the magnetic resonance signals that can be used to reconfigure an image is reduced, but this method can be realized by a simple structure.

(2) As shown in FIG. 17, the combining unit 8 may be omitted, and the reception switching unit 13 may be provided in place of the reception allocation unit 9, but the distribution unit 4 may be provided. That is, since increasing the number of channels in the transmission unit 3 is difficult, the above-explained effect obtained by the distribution unit 4 copes with the small number of the channels in the transmission unit 3. Further, since the number of the channels in the reception unit 3 can be readily increased as compared with the transmission unit 3, increasing the number N of the channels suppresses a reduction in the number of the magnetic resonance signals that can be utilized to reconfigure an image.

(3) The distribution unit 4 may distribute some of the transmission pulse signals for K channels.

(4) The transmission allocation unit 5 may be able to allocate the transmission pulse signals for one channel with respect to the RF coils 71a belonging to the plurality of RF coil groups 71.

(5) RF coils different from the RF coils 71a included in the array coils 7 may be connected.

(6) In the combining unit 8, the Q magnetic resonance signals belonging to each of P/T groups (T is a natural number greater than or equal to 2) may be combined by different T types of methods to obtain P combined signals. For example, four magnetic resonance signals may be subjected to each of in-phase combination, antiphase combination, QD (quadrature) combination, and anti-QD combination to obtain four combined signals. In this specific example, since Q=T, P=M is attained. However, setting Q>T enables achieving P<M, or setting Q<T enables attaining P>M. At this time, the Q magnetic resonance signals belonging to one group doe not necessarily have to be magnetic resonance signals obtained by the RF coils 71a belonging to the same RF coil group 71. For example, the four magnetic resonance signals respectively obtained by the four RF coils 71a aligned in the direction perpendicular to the body axis direction may be used to acquire four combined signals.

(7) The combining unit 8 does not have to use all of the M magnetic resonance signals input thereto for combination, and may output some of the magnetic resonance signals as they are. Furthermore, the magnetic resonance signals used for combination may be output as they are.

(8) The MRI apparatus may perform imaging based on a parallel imaging method.

In the parallel imaging method, the plurality of RF coils 71a are used to execute a sequence where a phase encoding step is thinned with respect to each RF coil 71a. Moreover, for example, image reconfiguration where a loopback image is developed by performing a matrix operation using sensitivity distributions of the respective coils 71a is executed with respect to the magnetic resonance signals acquired by the respective RF coils 71a. Usually, in the parallel imaging method, the sensitivity distributions of the respective RF coils 71a are acquired by pre-scanning. However, directly calculating the sensitivity distributions of the respective RF coils 71a is difficult, and sensitivity images acquired by the respective RF coils are generally respectively subjected to subtraction by using a sensitivity image of a body coil for an entire body (an all-body coil) having a relatively uniform sensitivity distribution, and an approximate coil sensitivity distribution is obtained to execute a matrix operation.

When selecting the RF coils 71a that are used for transmission in accordance with an FOV like the foregoing embodiment, pre-scanning is performed by using the selected RF coils 71a rather than the all-body coil, thereby generating a sensitivity image. As the sensitivity image as a subtraction target, an image obtained by combining the sensitivity images of the respective RF coils 71a can be used. Additionally, the sensitivity image of each RF coil 71a is subtracted from the combined image, thereby acquiring the sensitivity distribution of each RF coil 71a. In the example depicted in FIG. 13, although the four RF coils 71a for both transmission and reception are selected in accordance with a size of the FOV, a combined sensitivity image of the four selected RF coils 71a is used as a reference sensitivity image required for parallel imaging. As a result, it is possible to obtain a sensitivity image with less shading as compared with an image obtained by combining the sensitivity images of all the RF coils 71a.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A magnetic resonance imaging (MRI) apparatus that applies a gradient magnetic field and a radio-frequency magnetic field to a subject in a static magnetic field to image the subject based on magnetic resonance signals emitted from the subject, said MRI apparatus comprising:
    a unit which generates K (K being a natural number greater than or equal to 2) transmission radio-frequency pulse signals required to produce the radio-frequency magnetic field;
    an allocation unit which allocates the K transmission radio-frequency pulse signals to K of M (M being a natural number greater than or equal to 2, and M>K) transmission signal paths;
    a connection unit to which at most M radio-frequency coils are attachable and which selectively connects the M transmission signal paths and M reception signal paths to the radio-frequency coils;
    a selection unit which selects N (N being a natural number greater than or equal to 2, wherein N<M and N>K) magnetic resonance signals which are respectively received by the at most M radio-frequency coils and transmitted through the at most M reception signal paths; and
    a unit which performs reception processing for each of the selected N magnetic resonance signals.

2. The magnetic resonance imaging apparatus according to claim 1, further comprising a distribution unit which distributes at least one of the K transmission radio-frequency pulse signals to a plurality of signals so that the number of the transmission radio-frequency pulses is changed to S (S>K and S≦M),
    wherein the allocation unit allocates the respective S transmission radio-frequency pulse signals obtained by the distribution unit to S in the M transmission signal paths.

3. The magnetic resonance imaging apparatus according to claim 2, wherein the allocation unit allocates the transmission radio-frequency pulse signals to the transmission signal paths in such a manner that the plurality of transmission radio-frequency pulse signals distributed from the single transmission radio-frequency pulse signal are supplied to a plurality of radio-frequency coils aligned in a magnetic field direction of the static magnetic field.

4. The magnetic resonance imaging apparatus according to claim 1, further comprising a combining unit which combines the plurality of magnetic resonance signals transmitted through a plurality of paths in the M reception signal paths to obtain P (P≦M and P≧N) combined signals,
    wherein the selection unit selects N of the P combined signals.

5. The magnetic resonance imaging apparatus according to claim 4, wherein the allocation unit allocates the transmission radio-frequency pulse signals to the transmission signal paths in such a manner that the plurality of transmission radio-frequency pulse signals distributed from the one transmission radio-frequency pulse signal are supplied to a plurality of radio-frequency coils aligned in a first direction, and
    the combining unit combines the plurality of magnetic resonance signals obtained by a plurality of radio-frequency coils aligned in a second direction different from the first direction.

6. The magnetic resonance imaging apparatus according to claim 1, further comprising a combining unit which combines the plurality of magnetic resonance signals transmitted through a plurality of paths of the M reception signal paths based on different methods to obtain P (P≧N) combined signals,
    wherein the selection unit selects N of the P combined signals.

7. The magnetic resonance imaging apparatus according to claim 6, wherein the allocation unit allocates the transmission radio-frequency pulse signals to the transmission signal paths in such a manner that the plurality of transmission radio-frequency pulse signals distributed from the one transmission radio-frequency pulse signal are supplied to a plurality of radio-frequency coils aligned in a first direction, and
    the combining unit combines the plurality of magnetic resonance signals obtained by a plurality of radio-frequency coils aligned in a second direction different from the first direction.

8. The magnetic resonance imaging apparatus according to claim 1, wherein the connection unit includes M switchers each of which switches a connection destination of the radio-frequency coil based on the one transmission signal path or the one reception signal path, and
    the switcher comprises:

a first switch unit which turns on/off electrical coupling between the transmission signal path and the radio-frequency coil;

a low input impedance amplification unit having an input end connected with the radio-frequency coil; and a second switch unit which switches a state where grounding is achieved at a point distanced from an intersecting point of a signal path from the first switch unit to the radio-frequency coil and a signal path from the radio-frequency coil to the amplification unit toward the amplification unit side by an electrical length [$\lambda/4+(\lambda/2)\times(n-1)$ (where $\lambda$ is a wavelength of a magnetic resonance frequency and n is an integer)] and a state where grounding is not achieved, and a length of a signal line from the radio-frequency coil to the input end of the amplification unit is set in such a manner that an impedance matching section of the radio-frequency coil and the signal line are resonated in a state where the first switch unit is in an OFF state and the second switch unit does not achieve grounding of the input end of the amplification unit.

9. A magnetic resonance imaging (MRI) apparatus that applies a gradient magnetic field and a radio-frequency magnetic field to a subject in a static magnetic field to image the subject based on magnetic resonance signals emitted from the subject, said MRI apparatus comprising:

a unit which generates K (K being a natural number greater than or equal to 2) transmission radio-frequency pulse signals required produce the radio-frequency magnetic field;

an allocation unit which allocates the K transmission radio-frequency pulse signals to K of M (M beinq a natural number greater than or equal to 2, and M>K) transmission signal paths;

a unit which determines one or more of the at most M radio-frequency coils for transmission; and a unit which controls the allocation unit in such a manner that the transmission radio-frequency pulse signals are supplied to the one radio-frequency coil or the plurality of radio-frequency coils determined for transmission.

10. The magnetic resonance imaging apparatus according to claim 9, further comprising a unit which obtains sensitivity distributions of the plurality of radio-frequency coils determined for transmission based on the magnetic resonance signals received by the plurality of radio-frequency coils determined for transmission.

11. A magnetic resonance imaging (MRI) method using a magnetic resonance imaging apparatus that includes a connection unit to which at most M radio-frequency coils are attachable and which selectively connects the M (M being a natural number greater than or equal to 2 and M>K) transmission signal paths and M reception signal paths to the radio-frequency coils, and applies a gradient magnetic field and a radio-frequency magnetic field to a subject in a static magnetic field to image the subject based on magnetic resonance signals emitted from the subject, the MRI method comprising:

generating K (K being a natural number greater than or equal to 2 and M>K) transmission radio-frequency pulse signals required to generate the radio-frequency magnetic field;

allocating the K transmission radio-frequency pulse signals to K of the M transmission signal paths;

selecting N (N being a natural number greater than or equal to 2, N<M and N>K) in the magnetic resonance signals that are received by the at most M radio-frequency coils and transmitted through the at most M reception signal paths; and receiving the selected N magnetic resonance signals.

* * * * *